(12) United States Patent
Kurosawa et al.

(10) Patent No.: US 9,126,242 B2
(45) Date of Patent: Sep. 8, 2015

(54) METHOD FOR CLEANING BELL JAR, METHOD FOR PRODUCING POLYCRYSTALLINE SILICON, AND APPARATUS FOR DRYING BELL JAR

(75) Inventors: Yasushi Kurosawa, Niigata (JP); Kyoji Oguro, Niigata (JP); Shinichi Kurotani, Niigata (JP); Shigeyoshi Netsu, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/704,767

(22) PCT Filed: Mar. 7, 2011

(86) PCT No.: PCT/JP2011/001319
§ 371 (c)(1),
(2), (4) Date: Dec. 17, 2012

(87) PCT Pub. No.: WO2011/158404
PCT Pub. Date: Dec. 22, 2011

(65) Prior Publication Data
US 2013/0089489 A1    Apr. 11, 2013

(30) Foreign Application Priority Data
Jun. 16, 2010  (JP) .................................. 2010-137646

(51) Int. Cl.
*C01B 33/035* (2006.01)
*B08B 3/04* (2006.01)
(Continued)

(52) U.S. Cl.
CPC ... *B08B 3/10* (2013.01); *B08B 3/04* (2013.01); *C01B 33/035* (2013.01); *F26B 5/12* (2013.01); *F28G 13/00* (2013.01)

(58) Field of Classification Search
CPC ........ B08B 9/093; B08B 9/0936; B08B 3/02; B08B 3/04; F28G 13/00; C01B 33/027–33/035
USPC ............... 134/26, 30, 34, 37, 21, 22.1, 22.18; 34/402–404, 409–411, 417; 423/348–350
See application file for complete search history.

(56) References Cited

U.S. PATENT DOCUMENTS 5,108,512 A    4/1992   Goffnett et al.
6,114,475 A *  9/2000   Goode et al. .................... 526/62
(Continued)

FOREIGN PATENT DOCUMENTS

CN    101497443 A    8/2009
CN    101544371 A    9/2009
(Continued)

OTHER PUBLICATIONS
Air Products, "Dew Points," Oct. 14, 2011, retrieved from http://www.airproducts.com/products/Gases/gas-facts/dew-points.aspx on Mar. 31, 2014.*
(Continued)

*Primary Examiner* — Anthony J Zimmer
*Assistant Examiner* — Justin Bova
(74) *Attorney, Agent, or Firm* — Oblon, McClelland, Maier & Neustadt, L.L.P.

(57) ABSTRACT

A bell jar includes a metallic bell jar (1), and a metallic base plate (2) on which the bell jar (1) is placed, and packing (3) seals an inside of a container. To the base plate (2), a pressure gauge (4), a gas introduction line (5), and a gas discharge line (6) are connected so as to allow monitoring of internal pressure of the bell jar (1) and introduction and discharge of a gas. A vacuum pump (7) is provided in a path of the gas discharge line (6), and the vacuum pump (7) reduces internal pressure of the bell jar so as to be lower than vapor pressure of water. The vacuum pump (7) reduces the internal pressure of the bell jar so as to be lower than vapor pressure of water, thereby efficiently removing moisture, and completing drying of the bell jar in a short time.

12 Claims, 4 Drawing Sheets

(51) Int. Cl.
  *B08B 9/08* (2006.01)
  *B08B 3/10* (2006.01)
  *F28G 13/00* (2006.01)
  *F26B 5/12* (2006.01)

(56) References Cited

U.S. PATENT DOCUMENTS

| 2008/0038178 | A1 | 2/2008 | Altmann et al. | |
| 2008/0056979 | A1* | 3/2008 | Arvidson et al. | 423/350 |
| 2009/0188532 | A1 | 7/2009 | Endoh et al. | |
| 2009/0246113 | A1 | 10/2009 | Endoh et al. | |

FOREIGN PATENT DOCUMENTS

| CN | 101717995 A | 6/2010 | | |
| EP | 0235256 B1 * | 11/1994 | | H01L 21/306 |
| JP | 56 114815 | 9/1981 | | |
| JP | 6 216036 | 8/1994 | | |
| JP | 2008 37748 | 2/2008 | | |
| JP | 2009 196882 | 9/2009 | | |
| JP | 2009 256200 | 11/2009 | | |

OTHER PUBLICATIONS

Engineering Toolbox, http://www.engineeringtoolbox.com/boiling-point-water-d_926.html, Jan. 29, 2010, retrieved Aug. 6, 2014.*
International Search Report Issued Jun. 7, 2011 in PCT/JP11/001319, filed Mar. 7, 2011.
Combined Office Action and Search Report issued May 6, 2014, in Chinese Patent Application No. 201180029911.1 with English translation of category of cited documents.
Yang Tao, "The Discussion of the Improved Siem ens Process for Polysilicon in Design", *Gu izhou Chemical Industry*, vol. 34, No. 3, Jun. 30, 2009. pp. 7-11 (with its English abstract).

* cited by examiner

METHOD FOR CLEANING BELL JAR, METHOD FOR PRODUCING POLYCRYSTALLINE SILICON, AND APPARATUS FOR DRYING BELL JAR

CROSS REFERENCES TO RELATED APPLICATIONS

This application is a 371 of International Patent Application No. PCT/JP11/001319, filed on Mar. 7, 2011, and claims priority to Japanese Patent Application No. 2010-137646, filed on Jun. 16, 2010.

TECHNICAL FIELD

The present invention relates to a cleaning technique of a bell jar used for producing polycrystalline silicon, and more particularly to a method and an apparatus capable of efficiently removing moisture in an inner wall surface of the bell jar, which may cause mixing of impurity into polycrystalline silicon.

BACKGROUND ART

High purity polycrystalline silicon is a material for a single crystal silicon substrate for producing a semiconductor device, or a material for producing a solar cell. Generally, high purity polycrystalline silicon is produced batch-wise by a method (Siemens method) for performing pyrolysis or hydrogen reduction of a silicon-containing reaction gas as a source gas into high purity silicon, and precipitating the high purity silicon on a thin silicon filament rod. The silicon-containing reaction gas includes gases such as monosilane, dichlorosilane, trichlorosilane, and tetrachlorosilane, or a halogen gas generally represented by $SiH_nX_{4-n}$ (n=0, 1, 2, 3; X=Br, I).

A general precipitation reaction container used for producing high purity polycrystalline silicon is constituted by a metallic bed plate (base plate) and a metallic bell jar placed on the base plate, and an inside of the bell jar is a reaction space. It is necessary that the precipitation reaction container can be cooled and can seal a gas in the bell jar. This is because the reaction gas described above is corrosive, and may cause ignition or explosion by mixture with air.

If precipitation reaction of polycrystalline silicon is performed in the precipitation reaction container, during a CVD process, amorphous silicon dust is formed by a homogeneous nucleation process, and silicon adheres to an inner surface of the precipitation reaction container. The silicon dust contains a high level contaminant, and is settled on polycrystalline silicon as a product to cause surface defect or contamination (see Patent Literature 1).

Since the precipitation reaction of polycrystalline silicon described above is performed batch-wise, the inner surface of the bell jar inevitably comes into contact with the atmosphere when the polycrystalline silicon is taken out from the bell jar. The silicon-containing reaction gas as a source gas and chlorosilanes or halogen gases obtained as by-products by the precipitation reaction remain on the inner surface of the bell jar after the precipitation reaction of polycrystalline silicon. It is known that such gases become highly corrosive when reacting with moisture in the atmosphere.

The corrosive gas described above expresses and activates hazardous substances (for example, boron, aluminum, phosphorus, arsenic, antimony) that reduce quality of polycrystalline silicon, from a structure member on the inner surface of the bell jar.

Such hazardous substances are taken into polycrystalline silicon during a precipitation reaction process for a next batch to reduce quality of the polycrystalline silicon (for example, see Patent Literature 2).

From such circumstances, a precipitation bell jar is washed using high purity water or a carbon dioxide pellet for each batch or every few batches to clean the inner surface.

Meanwhile, generally, an automated washing apparatus is used for a bell jar because of a large inner surface area or difficulty in wiping in terms of structure. Patent Literatures 1 and 2 mentioned above and Patent Literature 3 disclose such a washing apparatus and a washing method using the apparatus.

CITATION LIST

Patent Literature

Patent Literature 1: Japanese Patent Laid-Open No. 6-216036
Patent Literature 2: Japanese Patent Laid-Open No. 2008-37748
Patent Literature 3: Japanese Patent Laid-Open No. 2009-196882

SUMMARY OF INVENTION

Technical Problem

A precipitation reactor (bell jar) for producing polycrystalline silicon is opened for each batch to take out a product therefrom. Then, washing is performed for each batch or every few batches to clean an inner surface.

Amorphous silicon or silane chloride polymer or the like adhering to the inner surface of the bell jar should be removed by washing. However, it is known that such a substance reacts with moisture to finally turn into a finely-powdered substance, and it is very difficult to completely remove moisture that has been taken into the finely powdered substance.

The present inventors have studied and revealed that in a conventional washing method of heating a bell jar using steam or the like and simultaneously replacing an inside of the bell jar with a high purity nitrogen gas or the like, it is difficult to completely remove moisture in a short time, while a longer drying time easily reduces quality of polycrystalline silicon to be produced for a next batch.

The present invention is achieved in view of the problems of the conventional bell jar cleaning technique, and has an object to provide a technique of efficiently removing moisture from an inner surface of a bell jar, completing cleaning of the bell jar in a short time, and thus increasing cleanliness of an inner surface of the bell jar to contribute to production of high purity polycrystalline silicon.

Solution to Problem

To achieve the object, the present invention provides a method for cleaning a bell jar used for producing polycrystalline silicon by the Siemens method, including: a washing step using water in the bell jar; and then a drying step of reducing pressure so that an inside of the bell jar has pressure lower than vapor pressure of water at an inner surface temperature to remove moisture.

Preferably, the drying step is a drying step of using a vacuum pump having vacuum reachability of 200 Pa or less, and reducing pressure so that air pressure in the bell jar is 1000 Pa or less.

The method for cleaning a bell jar according to the present invention preferably includes, after the drying step, a step of introducing a high purity inert gas with reduced moisture into the bell jar to return internal pressure to atmospheric pressure.

The present invention provides a method for producing polycrystalline silicon performed by repeating a plurality of times a precipitation step of polycrystalline silicon by the Siemens method, including, after completion of the precipitation step and before a precipitation step for a next batch, a cleaning step of a bell jar used for precipitating the polycrystalline silicon, wherein the cleaning step of the bell jar includes a water washing step of washing the bell jar using water, and a drying step subsequent to the water washing step, the drying step is a step of, after the water washing step, reducing pressure so that air pressure in the bell jar is 1000 Pa or less using a vacuum pump having vacuum reachability of 200 Pa or less, and thus reducing pressure so that an inside of the bell jar has pressure lower than vapor pressure of water at an inner surface temperature to remove moisture, and a time from completion of the water washing step to completion of the drying step is 1.2 hours or less.

Preferably, the cleaning step of the bell jar further includes, after the drying step, a step of introducing a high purity inert gas with reduced moisture into the bell jar to return internal pressure to atmospheric pressure.

Also, preferably, the time from completion of the water washing step to completion of the drying step is 0.8 hours or less. More preferably, the time from completion of the water washing step to completion of the drying step is 0.4 hours or less.

In the present invention, for example, the drying step is completed after a lapse of five minutes after the air pressure in the bell jar is 1000 Pa or less.

The present invention provides an apparatus for drying a bell jar used for producing polycrystalline silicon by the Siemens method, wherein the apparatus can form an airtight space by providing the bell jar, and includes a vacuum line for reducing air pressure in the airtight space, and a dry air line for returning the air pressure in the airtight space to normal pressure.

Advantageous Effect of Invention

In the present invention, instead of a conventional method of increasing a temperature of a surface of a bell jar to remove moisture, pressure in the bell jar is reduced to a boiling point of water or less to efficiently remove moisture. Thus, moisture can be efficiently removed from the inner surface of the bell jar, and cleaning of the bell jar can be completed in a short time. This increases cleanliness of the inner surface of the bell jar and significantly contributes to an increase in quality of high purity polycrystalline silicon to be produced.

DESCRIPTION OF EMBODIMENT

Now, with reference to the drawings, a bell jar cleaning method and a bell jar drying apparatus according to the present invention will be described.

Figure 1:
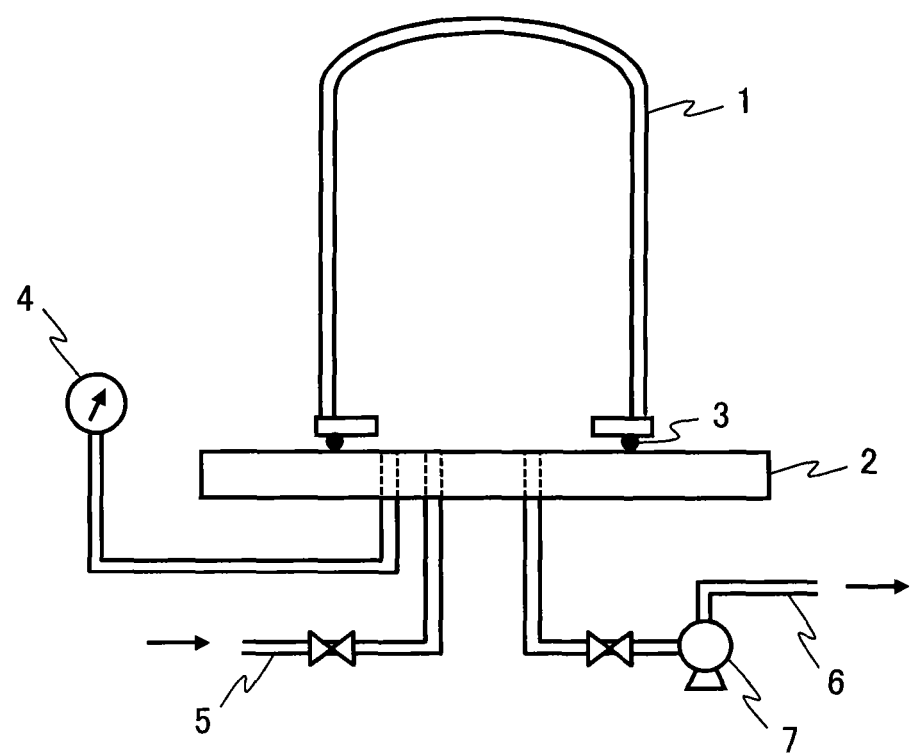
FIG. 1 illustrates an exemplary configuration of a bell jar drying apparatus according to the present invention.

FIG. 1 illustrates an exemplary configuration of the bell jar drying apparatus according to the present invention. The bell jar drying apparatus is an apparatus for drying a bell jar used for producing polycrystalline silicon. The bell jar includes a metallic bell jar 1, and a metallic bed plate (base plate) 2 on which the bell jar 1 is placed, and packing denoted by reference numeral 3 seals an inside of a container. An inside of the bell jar 1 placed on the base plate 2 is a space for precipitation reaction of polycrystalline silicon.

To the base plate 2, a pressure gauge 4, a gas introduction line 5, and a gas discharge line 6 are connected so as to allow monitoring of internal pressure of the bell jar 1 and introduction and discharge of a gas. A vacuum pump 7 is provided in a path of the gas discharge line 6, and the vacuum pump 7 reduces internal pressure of the bell jar so as to be lower than vapor pressure of water.

Usually, an automatic valve or the like is placed on a suction side of the vacuum pump 7 so as to prevent backflow of oil in the vacuum pump 7 to the bell jar 1 during stop of the vacuum pump 7. However, a phenomenon is known in which frequent repetitions of operation and stop of the vacuum pump causes backflow of oil through an inner surface of a pipe. Thus, the vacuum pump 7 is desirably of a low contamination type such as a dry vacuum pump. As an ability of the vacuum pump, a discharging ability may be selected according to a size of a bell jar to be used, and a vacuum pump having vacuum reachability of about 200 Pa or less may be used.

In an aspect shown in FIG. 1, the bell jar itself used for producing polycrystalline silicon constitutes a part of the drying apparatus, but the present invention is not limited to the aspect.

As described above, in the present invention, the vacuum pump 7 reduces internal pressure of the bell jar so as to be lower than vapor pressure of water, thereby efficiently removing moisture, and completing drying of the bell jar in a short time.

As described above, a trace quantity of amorphous silicon or silane chloride polymer or the like adheres to the inner surface of the bell jar used for the precipitation reaction of polycrystalline silicon. The amorphous silicon or silane chloride polymer expresses and activates hazardous substances with respect to quality of the polysilicon described above from the surface of the bell jar in the presence of moisture, thereby preventing cleaning of the bell jar. Thus, to produce high purity polycrystalline silicon, after completion of washing, moisture adhering to the inner surface of the bell jar needs to be efficiently removed to prevent generation of the contamination substance.

The present inventors have repeatedly studied, and decided to use a method of reducing pressure in the bell jar to be a boiling point of water or less to efficiently remove moisture instead of a conventional method of increasing a temperature of a surface of the bell jar to remove moisture.

An advantage of using this method is, first, a reduction in drying time by efficient removal of moisture.

It is considered that if a cleaning operation time of the bell jar is increased, a time when the inside of the bell jar is in an open state is necessarily increased, which reduces cleanliness of the inner wall of the bell jar. The reduction in the drying time means a reduction in the cleaning operation time, and is thus effective for increasing cleanliness of the inner wall of the bell jar.

The present inventors have studied and found that after cleaning of the bell jar after completion of the polycrystalline silicon production step, cleanliness of the inner wall of the bell jar in a stage for preparation of a next polycrystalline silicon production step depends on a time from after washing of the bell jar to completion of drying rather than a total open time of the inside of the bell jar during this time. Thus, if a drying step requires a long time as in a conventional drying method, the inner wall of the bell jar cannot be maintained in a clean state, thereby increasing the risk of reducing quality of polycrystalline silicon in a next production step. Also in this respect, reducing a drying time by efficient removal of moisture in the inner surface of the bell jar is extremely effective for producing high purity polycrystalline silicon.

The dry state of the bell jar can be monitored by a pressure reduction gauge as the most convenient method. A more accurate dry state can be determined by a degree of pressure reduction. Specifically, the dry state can be determined by the degree of pressure reduction being a value specific to a drying apparatus including a vacuum pump and a bell jar by completion of vaporization of moisture.

The dry state of the apparatus can be confirmed by terminating pressure reduction drying of the bell jar in midstream, returning to normal pressure with a dry gas, and then measuring a dew point of the gas in the drying apparatus with the normal pressure. Based on such data, for example, an operational standard of the drying step for obtaining a dew point of −40° C. or less or −60° C. or less may be prepared.

In the case of drying a large bell jar, particularly, a bell jar having a capacity of 1 m$^3$ or more, checking of the dry state by releasing pressure reduction as described above is difficult in practice. Then, the dry state is preferably monitored while being in the pressure reduction state. In such a case, the dry state is checked by the degree of pressure reduction, and for example, a time after a lapse of five minutes after the degree of pressure reduction is 1000 Pa or less is regarded as completion of drying with the dew point being −40° C. or less.

In addition to the advantage of reduction in the drying time, there is an advantage of eliminating the need for steam for heating. The size of the bell jar has been increased, and the increase in the size increases a heat capacity of the bell jar itself. Also, generally, the bell jar includes a jacket containing cooling water or a heat medium therein, thereby further increasing a total heat capacity for heating the bell jar.

If such a bell jar having a large heat capacity is to be dried by steam heating, there are a need to increase a steam temperature and also a need for large equipment. If steam is directly introduced into the jacket, an extraction operation thereafter is also required.

In contrast to this, in the case of using the method of reducing pressure in the bell jar to a boiling point or less of water to efficiently remove moisture as in the present invention, the bell jar preferably has a large total heat capacity. This is because even if vaporization of moisture takes heat, the temperature of the inner surface of the bell jar is hard to change.

An advantage of using the method of reducing pressure in the bell jar to a boiling point or less of water to remove moisture is also that an amount of high purity gas consumed in the drying operation can be significantly saved. The conventional steam heating method requires a large amount of high purity inert gas as a carrier gas for discharging vaporized moisture to the outside of the ball jar and a replacement gas for preventing re-adsorption of moisture to the inside of the bell jar after removal of moisture.

In contrast to this, by the method of bringing the inside of the bell jar into the pressure reduction state to remove moisture, there is no need to use a carrier gas to discharge moisture to the outside of the bell jar, and further, for replacement of the inside of the bell jar with an inert gas, an object is sufficiently achieved only by using a high purity inert gas when the inside of the bell jar is returned to atmospheric pressure after completion of the drying operation.

Now, an increase in quality of polycrystalline silicon by a reduction in time for the cleaning step according to the present invention will be described.

Table 1 shows a result of checking, for 12 polycrystalline silicon production batches, the open time of the bell jar and the time from completion of the water washing step of the bell jar to assembling as a polycrystalline silicon producing reactor for a next batch, and electric resistivity of polycrystalline silicon.

TABLE 1

| BATCH | OPEN TIME [TIME] | TIME AFTER WATER WASHING [TIME] | ELECTRIC RESISTIVITY [Ω·cm] |
|---|---|---|---|
| 1 | 4.0 | 1.2 | 1633 |
| 2 | 7.5 | 0.8 | 2400 |
| 3 | 12.3 | 2.3 | 731 |
| 4 | 4.3 | 2.5 | 829 |
| 5 | 10.2 | 2.0 | 1414 |
| 6 | 7.0 | 1.5 | 1498 |
| 7 | 7.4 | 1.5 | 1473 |
| 8 | 9.5 | 1.7 | 1328 |
| 9 | 8.7 | 1.7 | 1750 |
| 10 | 8.8 | 1.7 | 894 |
| 11 | 4.9 | 1.5 | 985 |
| 12 | 3.1 | 0.4 | 2510 |

As shown in Table 1, when the time from completion of the water washing step to completion of the drying step was 1.2 hours or less, polycrystalline silicon having electric resistivity of 1500 Ω·cm or more was obtained. When the time from completion of the water washing step to completion of the drying step was 0.8 hours or less, polycrystalline silicon having electric resistivity of 2000 Ω·cm or more was obtained. Further, when the time from completion of the water washing step to completion of the drying step was 0.4 hours or less, polycrystalline silicon having electric resistivity of 2500 Ω·cm or more was obtained.

Figure 2:
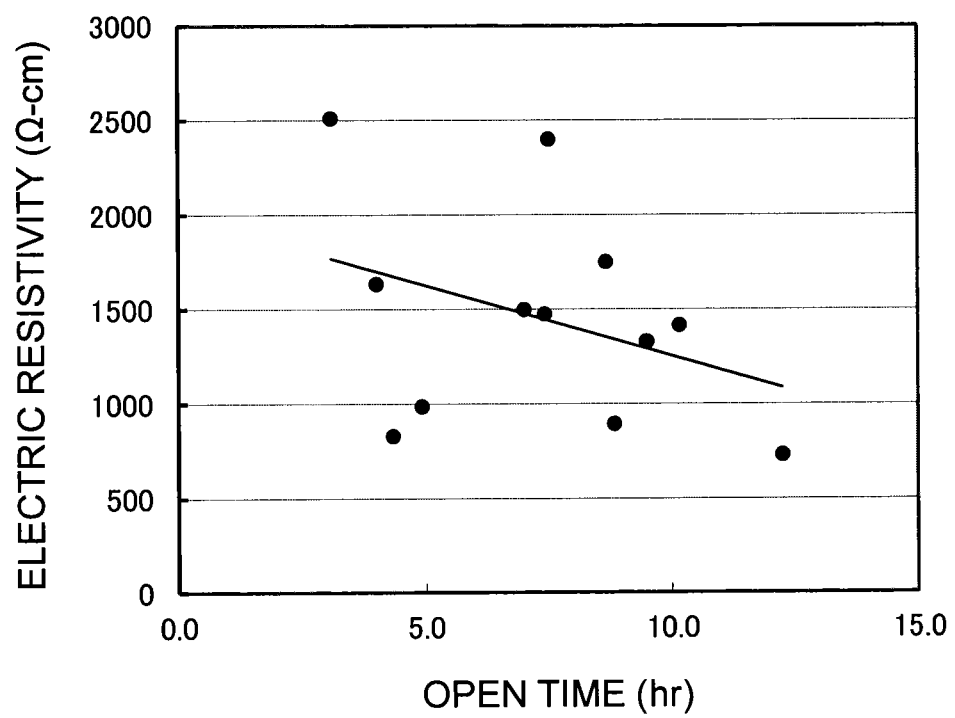
FIG. 2 illustrates a result of checking a relationship between an open time of a bell jar and electric resistivity of polycrystalline silicon.

FIG. 2 illustrates a result of checking a relationship between the open time of the bell jar and the electric resistivity of the polycrystalline silicon. The open time of the bell jar refers to a time when the bell jar is in the open state after completion of the polycrystalline silicon production step until start of a next polycrystalline silicon production step. Specifically, a time after completion of the polycrystalline silicon production step for a previous batch until the bell jar is opened to take out the polycrystalline silicon, cleaning of the bell jar (conveyance, water washing, conveyance, removal of moisture in the inner surface, replacement of the inside of the bell jar with a high purity inert gas) is performed, and assembling as a reactor for the polycrystalline silicon production step for a next batch is completed is the open time of the bell jar.

It can be read from FIG. 2 that electric resistivity of polycrystalline silicon tends to be reduced with increasing open time. The reduction in electric resistivity refers to an increase in level of electrically active impurity taken into the polycrystalline silicon, and it is found that high purity of the polycrystalline silicon tends to be prevented with increasing open time. Specifically, it can be read that the reduction in the open time of the bell jar described above is effective for producing high purity polycrystalline silicon.

Figure 3:
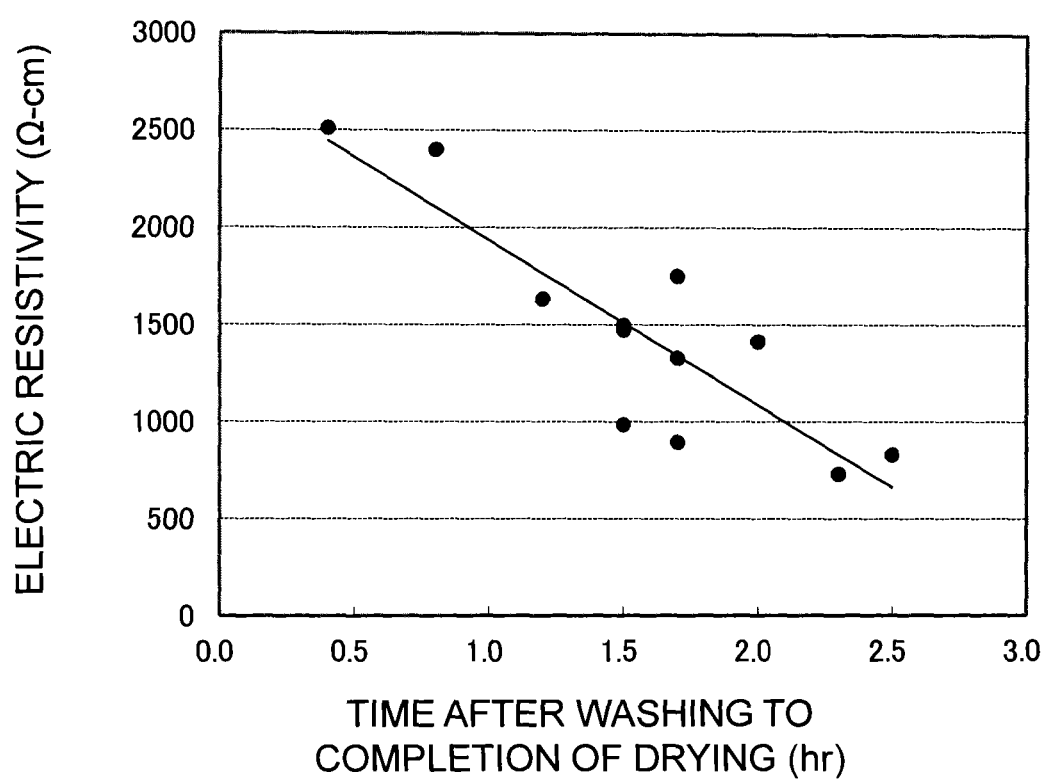
FIG. 3 illustrates a result of checking a relationship between a time from completion of a water washing step of the bell jar to assembling as a polycrystalline silicon producing reactor for a next batch to generate a vacuum therein, and electric resistivity of polycrystalline silicon.

FIG. 3 illustrates a result of checking a relationship between a time from completion of water washing of the bell jar to completion of drying, and electric resistivity of polycrystalline silicon. The completion of the drying step is a time when a vacuum is maintained for 10 minutes after the pressure gauge indicates a fixed value during pressure reduction by the vacuum pump described above.

It can be read from FIG. 3 that the time from completion of water washing of the bell jar to completion of drying, and the electric resistivity of the polycrystalline silicon can be approximated by a line obtained by a least square method, and electric resistivity of polycrystalline silicon is reduced with time. Specifically, to control quality of the polycrystalline silicon, it is more effective to reduce the time from completion of the water washing step to completion of the drying step rather than reduce the open time of the bell jar, and it is found that reducing the time of the drying step using the vacuum pump is an extremely effective method for production of the bell jar high purity polycrystalline silicon.

EXAMPLES

Now, the cleaning technique according to the present invention will be described using examples.

First, after completion of the precipitation step of the polycrystalline silicon, the bell jar 1 is opened, moved to a washing apparatus, and subjected to a washing operation by a normal procedure. After completion of the washing operation, the bell jar 1 is placed on the base plate 2 by a crane or the like to assemble a drying apparatus. In this state, the vacuum pump 7 is operated to reduce pressure in the bell jar 1 to be vapor pressure of water or less. The pressure reduction causes moisture adhering to the inner surface of the bell jar 1 to be discharged to the outside of the bell jar 1 in the washing step.

Set pressure in the pressure reduction needs to be set so that the inside of the bell jar 1 has pressure lower than vapor pressure of water at the inner surface temperature, but when a vacuum pump having vacuum reachability of about 200 Pa or less is used, a target dry state can be reached in a short time without caring about the temperature.

When moisture or attachment on the inner surface of the bell jar 1 vaporizes, heat of vaporization is taken from the bell jar 1 and the base plate 2, but the bell jar 1 and the base plate 2 have a sufficiently large heat capacity, and a reduction in temperature can be virtually ignored.

The moisture or attachment on the inner surface of the bell jar 1 quickly vaporizes with reduction in pressure. When the pressure gauge is used to check entry into a dry state, a time after a lapse of preferably five minutes after the internal pressure of the bell jar 1 reaches 1000 Pa or less can be regarded as completion of drying, but in view of stability or the like of the apparatus, pressure reduction is preferably maintained for further five minutes or more. Behavior of the pressure gauge in this duration can be observed to check that there is no abnormality in a monitor system.

After completion of the drying step of holding the inside of the bell jar 1 at predetermined pressure, operation of the vacuum pump 7 is stopped, a high purity inert gas without moisture is introduced into the bell jar 1 to turn internal pressure into atmospheric pressure. The high purity inert gas is introduced in order to prevent reentry of moisture into the bell jar 1, and is preferably a gas having a dew point of −40° C. or less. A nitrogen gas is desirable as an inert gas.

It is preferable that the cleaned bell jar 1 and the base plate 2 are assembled as quickly as possible as a polycrystalline silicon producing reactor, and a standby state for production for a next batch, that is, a state where cleanliness is maintained with an inert gas such as hydrogen or nitrogen is preferably entered.

Table 2 shows a result of checking a relationship between a dry state and a pressure reduction maintaining time when a bell jar having an inner volume of $3.5m^3$ is dried by the method of the present invention. Vacuum reachability in specification of the vacuum pump used at this time was 20 Pa, but the degree of vacuum of the inside after a lapse of 7 minutes was 1000 Pa or less, and then the degree of vacuum of 1000 Pa or less was maintained. For the dry state, a high purity nitrogen gas was introduced into a chamber after completion of pressure reduction to return to atmospheric pressure, and further a nitrogen gas (carrier gas) having a flow rate of 200 NL/min was passed to measure a dew point. Thus, a precipitation bell jar is washed using high purity water or a carbon dioxide pellet for each batch or every few batches to clean the inner surface.

TABLE 2

| TIME (min) | DEW POINT (° C.) |
|---|---|
| 5 | −35 |
| 7 | −42 |
| 10 | −61 |
| 20 | −65 |
| 30 | −72 |
| 40 | −72 |

As shown in Table 2, it was confirmed that a dew point of a carrier gas when pressure reduction was released with the carrier gas was lower than −40° C. in a pressure reduction holding time of 7 minutes, and reached −61° C. in 10 minutes or more, and a sufficient dry state was obtained.

In contrast to this, drying by steam heating requires a long time to obtain a dry state equal to the above.

Table 3 shows a result of introducing a heat medium by steam heating into a jacket of a bell jar having the same inner volume as the above, heating and holding the bell jar at about 110° C., supplying a high purity nitrogen gas of 200 NL/min (dew point of −72° C.) into the bell jar, and evaluating a dew point of the nitrogen gas (carrier gas) using a dew point meter.

Figure 4:
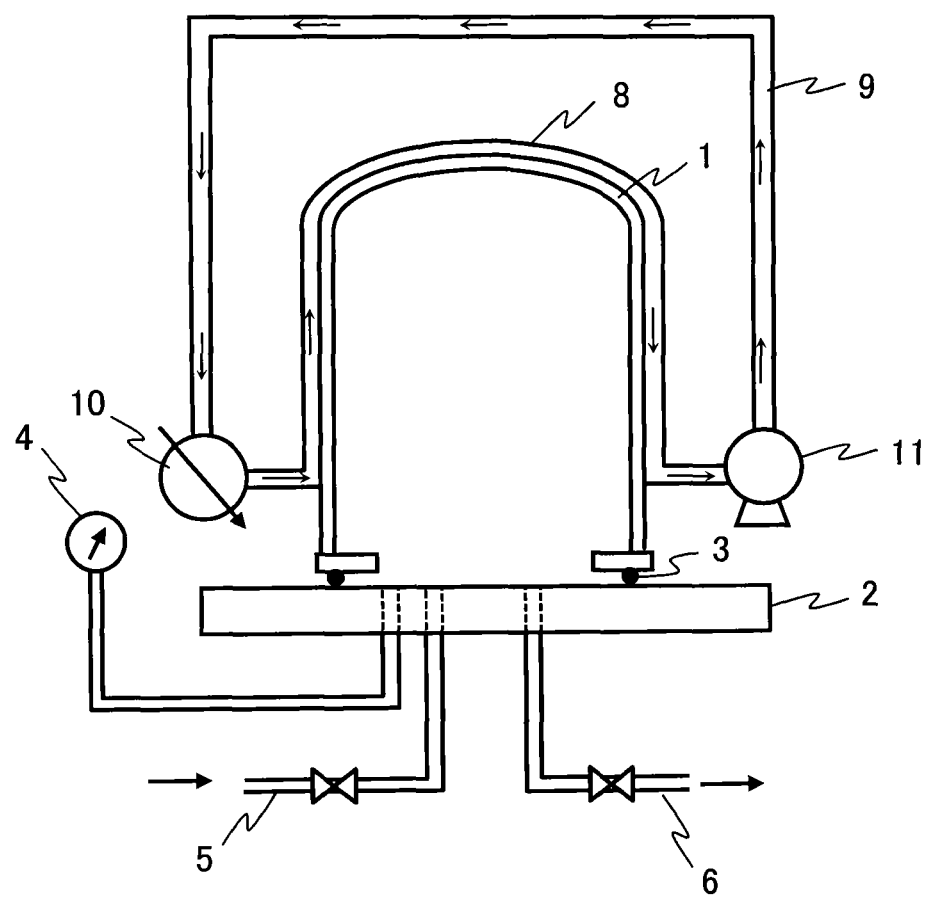
FIG. 4 illustrates an exemplary configuration of a bell jar drying apparatus used for steam drying.

FIG. 4 illustrates a configuration of a bell jar drying system used in this measurement. In FIG. 4, reference numeral 8 denotes a jacket, reference numeral 9 denotes a heat medium circulating path, reference numerals 10 and 11 denote a heat exchanger and a heat medium circulating pump.

TABLE 3

| TIME (hr) | DEW POINT (° C.) |
|---|---|
| 1 | >−30 |
| 2 | >−30 |
| 3 | −32 |
| 4 | −41 |
| 5 | −49 |
| 6 | −55 |
| 7 | −58 |
| 8 | −61 |
| 9 | −62 |
| 10 | −64 |
| 12 | −64 |

A time before a dew point of a carrier gas reaches −60° C. or less as a target of drying is 8 hours or more, and requires a long time about 50 times of that of the present invention.

INDUSTRIAL APPLICABILITY

According to the present invention, moisture is efficiently removed from the inner surface of the bell jar, thereby reducing a time for cleaning the bell jar. This provides a technique of increasing cleanliness of the inner surface of the bell jar to contribute to production of high purity polycrystalline silicon.

REFERENCE SIGNS LIST 1 bell jar
2 base plate
3 packing
4 pressure gauge
5 gas introduction line
6 gas discharge line
7 vacuum pump
8 jacket
9 heat medium circulating path
10 heat exchanger
11 heat medium circulating pump

The invention claimed is:

1. A method for producing polycrystalline silicon, said method comprising:
repeating a plurality of times a precipitation of polycrystalline silicon by the Siemens method in a bell jar, wherein
after completion of precipitation of a batch of polycrystalline silicon and before a precipitation of a next batch of polycrystalline silicon, cleaning said bell jar by the following method of cleaning a bell jar:
washing said bell jar by contacting water with an inside of said bell jar; and then
drying said bell jar by reducing a pressure inside of said bell jar to a pressure of 1000 Pa or less to remove moisture, using a vacuum pump capable of achieving 200 Pa or less; and then
introducing a high purity inert gas having a dew point of −40° C. or less into said bell jar to return the pressure inside of said bell jar to atmospheric pressure,
wherein a time from completion of the washing to completion of the drying is 1.2 hours or less,
to obtain polycrystalline silicon having an electric resistivity of 1500 Ω·cm or more.

2. The method of claim 1, wherein the time from completion of the washing to completion of the drying is 0.8 hours or less, to obtain polycrystalline silicon having an electric resistivity of 2000 Ω·cm or more.

3. The method of claim 2, wherein the time from completion of the washing to completion of the drying is 0.4 hours or less, to obtain polycrystalline silicon having an electric resistivity of 2500 Ω·cm or more.

4. The method of claim 1, wherein the drying is completed after a lapse of five minutes after the pressure inside of the bell jar is 1000 Pa or less.

5. The method of claim 1, wherein said high purity inert gas is nitrogen.

6. The method of claim 1, wherein said high purity gas has a dew point of −60° C. or less.

7. The method of claim 1, wherein the drying comprises maintaining the pressure inside of said bell jar at 1000 Pa or less for five minutes or more, such that after the high purity inert gas returns the pressure inside of said bell jar to atmospheric pressure, a dew point inside of said bell jar is less than or equal to −35° C.

8. The method of claim 1, wherein the drying comprises maintaining the pressure inside of said bell jar at 1000 Pa or less for seven minutes or more, such that after the high purity inert gas returns the pressure inside of said bell jar to atmospheric pressure, a dew point inside of said bell jar is less than or equal to −42° C.

9. The method of claim 1, wherein the drying comprises maintaining the pressure inside of said bell jar at 1000 Pa or less for ten minutes or more, such that after the high purity inert gas returns the pressure inside of said bell jar to atmospheric pressure, a dew point inside of said bell jar is less than or equal to −61° C.

10. The method of claim 1, wherein the drying comprises maintaining the pressure inside of said bell jar at 1000 Pa or less for 20 minutes or more, such that after the high purity inert gas returns the pressure inside of said bell jar to atmospheric pressure, a dew point inside of said bell jar is less than or equal to −65° C.

11. The method of claim 1, wherein the drying comprises maintaining the pressure inside of said bell jar at 1000 Pa or less for 30 minutes or more, such that after the high purity inert gas returns the pressure inside of said bell jar to atmospheric pressure, a dew point inside of said bell jar is less than or equal to −72° C.

12. The method of claim 1, wherein the drying comprises maintaining the pressure inside of said bell jar at 1000 Pa or less for 40 minutes or more, such that after the high purity inert gas returns the pressure inside of said bell jar to atmospheric pressure, a dew point inside of said bell jar is less than or equal to −72° C.

* * * * *